(12) United States Patent
Athanassiadis

(10) Patent No.: US 6,671,197 B2
(45) Date of Patent: Dec. 30, 2003

(54) CONTEST ADDRESSABLE MEMORY (CAM) WITH TRI-STATE INVERTERS FOR DATA STORAGE

(75) Inventor: Harry Haralambos Athanassiadis, Basingstoke (GB)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 10/113,813

(22) Filed: Mar. 27, 2002

(65) Prior Publication Data
US 2002/0163824 A1 Nov. 7, 2002

(30) Foreign Application Priority Data
Mar. 29, 2001 (GB) .............................. 0107935

(51) Int. Cl.$^7$ .......................... G11C 15/00; G11C 11/00
(52) U.S. Cl. .......................... 365/49; 365/154; 365/149
(58) Field of Search .......................... 365/49, 187, 188, 365/149, 154

(56) References Cited

U.S. PATENT DOCUMENTS

| | | | |
|---|---|---|---|
| 3,795,898 A | | 3/1974 | Mehta et al. |
| 5,452,243 A | * | 9/1995 | Ansel et al. ................. 365/49 |
| 6,233,652 B1 | * | 5/2001 | Mathews et al. ........... 711/108 |

FOREIGN PATENT DOCUMENTS

| | | |
|---|---|---|
| GB | 1567147 | 5/1980 |
| GB | 2281427 A | 3/1995 |
| JP | 2-244492 A | of 1990 |
| WO | WO 00/19444 A1 | 4/2000 |
| WO | WO 00/74064 A1 | 12/2000 |

OTHER PUBLICATIONS

UK Search Report, dated Oct. 17, 2002.
UK Search Report, dated Apr. 2, 2003.

* cited by examiner

Primary Examiner—Richard Elms
Assistant Examiner—Jung H. Hur
(74) Attorney, Agent, or Firm—Klarquist Sparkman LLP

(57) ABSTRACT

A memory device includes an array of memory cells. When in use, each cell can store a charge representing a binary digit of data. Data lines are connected to the memory cells. The data lines are connected to both apply a voltage to the cells to store the charge and to receive a voltage from charge stored in the cells to read a binary digit of data. Read lines are connected to the cells to selectively connect the cell to the data line to apply voltage either from the data lines to the cells or from the cells to the data lines. Control lines also connect to the cells to configure the cells to provide a capacitance to which the data lines can apply voltage and to configure the cells to maintain charge stored in the cells by virtue of a power supply.

12 Claims, 8 Drawing Sheets

CONTEST ADDRESSABLE MEMORY (CAM) WITH TRI-STATE INVERTERS FOR DATA STORAGE

The present invention relates to a memory device for storing data in a computer, digital signal processor or such like and, in particular, to the structure of memory cells of which the memory device is comprised.

Data is generally stored by memory devices of computers, digital signal processors and such like in a binary data, i.e. as 0s and 1s. These binary digits (bits) are represented in various ways according to the type of memory device in which it is stored.

Signals in computers, digital signal processors or such like generally represent data as high and low voltages, e.g. bit 1 is represented by a HIGH voltage and bit 0 is represented by a LOW voltage. In particular, a voltage above a particular threshold may be considered as HIGH and to represent bit 1 and a voltage of 0V or below a particular threshold may be considered as LOW or to represent bit 0. Similarly, certain memory devices store binary data electronically, e.g. as high and low charges, whereas other memory devices, such as HDDs (Hard Disk Drives) or CD-ROMs (Compact Disk—Read Only Memories) store binary data magnetically or optically.

This invention concerns memory devices which represent data electronically. One such type of memory is a RAM (Random Access Memory), which is widely used in personal computers as well as many other electronic devices. RAMs store data electronically, generally for as long as power is provided to the RAM. They generally comprise an array of transistors or capacitors formed as a semiconductor device, i.e. as a microchip formed from layers of semiconducting materials on a silicone substrate.

Some RAMs, known as DRAMs (Dynamic Random Access Memories), store electrical charges on the gates of transistors or capacitors, which charges represent binary data. Other RAMs, known as SRAMs (Static Random Access Memories), have transistors arranged effectively as switches, the state of which is representative of the stored data.

RAMs generally comprise an array of memory cells, each of which can store one bit, i.e. 0 or 1. The array of cells is generally arranged in columns and rows. Each column may be connected to a pair of data lines or "bit lines" that can apply voltages representing data to a column of cells and which are also connected to a detection device known as a "sense amplifier". Similarly, each row of cells may be connected to a read/write line or "word line" for activating a row of cells. Data can be written to a cell by providing voltages representing the data to be stored on the data lines of the column of a cell and activating the cell with the appropriate read/write line. Similarly, data can be read from a cell by activating the cell with the appropriate read/write line and the sense amplifier sensing any voltage generated on the data lines of the cell's column.

Each memory cell has a unique address in the array and a control structure of the RAM can selectively control the writing of data to or the reading of data from the different cells in the array using the cells' addresses. Particular control strategies can be used to decide to which cells data should be written. In order to read data from the RAM it is necessary for the address of cells to which the data has been written to be known by or provided to the control structure. This is not straightforward and it is largely the data processing required for locating or "addressing" memory cells for reading and writing that limits the speed of conventional RAMs.

In order to alleviate the problems of such addressing systems, it is possible to arrange electronic memories in different ways. In particular, a memory device known as a CAM (Content Addressable Memory) implements what is known a "associative processing" to improve the speed with which data stored in an electronic memory can be used. CAMs hate structures very similar to those of RAMs, but additionally allow all of the memory cells of the CAM to be searched for a given piece of data in a single operation. CAMs are therefore sometimes described as SIMD (Single Instruction Multiple Data) type electronic devices.

CAMs are useful as memory devices for particular types of application. For example, where it is desired to frequently compare data to a reference or "look-up" table, the reference data may be stored in the CAM and the entire table searched for the given data in a single operation. This might be useful in certain types of data routing operations, image processing or database searching.

CAMs generally comprise memory cells arranged in an array and have data lines and read/write lines arranged in a similar way to those of a RAM. Additionally, special detection lines known as match lines may be connected to the rows of memory cells, the cells being arranged to discharge to the match lines according to whether or not data applied to the respective data lines matches the data stored in the cells.

Memory cells of CAMs are generally similar to memory cells of RAMs, although additional circuits are required to connect the memory cells of CAMs with the match lines. In the same way as for RAMs, CAMs may be described as Static CAMs or Dynamic CAMs depending on the structure of their memory cells. Static CAMs have memory cells comprising transistors effectively arranged as a switch, or in other words as a latch or flip flop. Once a data bit has been written to a Static CAM cell, the state of the cell will remain unchanged until it is specifically altered or until power is removed from the device. Dynamic RAMs have memory cells generally formed of fewer transistors and which store data as a charge on a capacitor or the gate of a transistor. Each memory cell of a Dynamic CAM must be periodically recharged or "refreshed" to retain its charge and hence the stored data.

In more detail, a conventional static CAM comprises an array of static CAM cells, one of which cells is shown in FIG. 1. The cells are connected in columns to pairs of data lines DS1, DS0 and in rows to read/write lines RW and match lines M. Transistors T3, T4, T5 and T6 are connected so as to form two cross-coupled inverters connected between power supply VDD and ground VSS, each side of the input/output connection of the cross-coupled inverters respectively forming node A and node B. The gates of read/write transistors T1 and T2 are connected to the read/write line RW such that they are activated when a voltage is applied to the read/write line RW. The gates of node transistors T7 and T8 are connected to node A and node B respectively such that they are activated when the node to which they are connected is has a voltage applied to it. When the transistors T7 or T8 are activated, match transistor T9 can be activated by a voltage on a data line DS1, DS0 to connect match line M to ground such that it discharges.

Data is stored in the static CAM cell as the particular state of the cross coupled inverters and hence as particular voltages on nodes A and B. Node A being HIGH and node B being LOW corresponds with binary digit 1. Node A being LOW and node B being HIGH corresponds with binary digit 0. In order to write data to the static CAM cell, voltages corresponding to the respective voltages desired on nodes A and B to represent the desired binary digit are applied to data lines DS1, DS0 and the read/write transistors T1, T2 are activated by read/write line RW. Thus, in order to write binary digit 1 to the memory cell, data line DS1 is charged HIGH and data line DS0 is charged LOW. Likewise, in order to write binary digit 0 to the memory cell, data line DS1 is charged LOW and data line DS0 is charged HIGH.

After the appropriate voltages have been applied to nodes A and B, the read/write transistors T1, T2 are deactivated by read/write line RW. The data is stored in the cell as the cross coupled inverters retain their state and nodes A and B retain their applied voltages unless power VDD is removed. It is this feature of the static CAM cell which gives rise to the term "static".

Data can be read from the static CAM cell by applying voltage VDD to data lines DS1 and DS0 and activating transistors T1 and T2 with read/write line RW. One of the data lines DS1, DS0 will be discharged to ground VSS and a sense amplifier connected to the data lines DS1, DS0 can detect the voltage change of the data line and determine from this what voltage was on nodes A and B and whether bit 0 or 1 was stored by the cell.

In order to perform a "match" operation, the match line M is precharged to a given voltage and complementary data (in relation to the voltages on nodes A and B that would represent the binary digit being searched for) is applied to data lines DS1, DS0. In other words, to search for binary digit 1, which is stored as HIGH on node A and LOW on node B, the opposite voltages are applied to the data lines, i.e. data line DS1 is charged LOW and data line DS0 is charged HIGH. Similarly, in order to match binary digit 0, which is stored as LOW node A and HIGH on node B, the opposite voltages are again applied to data lines DS1 and DS0, i.e. data line DS1 is charged HIGH and data line DS0 is charged LOW.

Where the desired voltages are found on nodes A and B, the match line will remain high. However, should the desired voltages not be found on either of nodes A or nodes B, transistor T9 will be activated and the match line will be discharged. Thus, any number of cells connected to the match line may be searched and, should any of the cells not match the desired data, the discharging of the match line M will be detected by sensing circuitry connected to the match line M. In contrast, should all of the cells contain the desired data, the match line M will remain charged and a match will be detected by sensing circuitry.

Conventional static CAM cells have a number of problems. The cross-coupled inverters form a flip-flop and a high switching current is generated when the state of the flip-flop is changed. This creates a problem in semiconductor chip design in that power consumption by the chip is increased by the high switching currents and it is generally desirable for a semiconductor chip to consume as little power as possible. Likewise, high currents generate heat in the semiconductor chip and it may be necessary to adopt special strategies in order to prevent this from having a destructive effect on the chip. Another problem is that, as the cells are connected in parallel, the resistance across which the voltages of the data lines is applied decreases with the number of cell that are written to at once. This can lead to a large change in resistance according to the number of cells that are written to and the circuits for driving the data lines must therefore be powerful. This adds to the power distribution problems of the semiconductor chip. A yet further problem is that "latch-up" can occur, which is a well known problem with this type of device.

A dynamic CAM cell is illustrated in FIG. 2, which cell comprises five transistors MD, MS0, MS1, MW0 and MW1.

Charges representing a binary digit are stored on the gates of node transistors MS0 and MS1. The gate of node transistor MS0 being LOW and the gate of node transistor MS1 being HIGH represents bit 1. The gate of node transistor MS0 being HIGH and the gate of node transistor MS1 being LOW represents bit 0. The dynamic CAM cell can additionally represent a "don't care" state when the gates of both the node transistors MS0 and MS1 are LOW. The don't care state effectively masks the memory cell as described further below.

In order to write data to the dynamic CAM cell, read/write transistors MW0 and MW1 are activated by read/write line RW. At the same time voltages that it is desired to apply to the gates of node transistor MS0 and MS1 are respectively applied to data lines DS0 and DS1. In other words, to write 1, DS0 is charged LOW and DS1 is charged HIGH and, to write 0, DS0 is charged HIGH and DS1 is charged LOW. When read/write transistors MW1 are subsequently turned off the appropriate charge is stored on the gates of the transistors MS0 and MS1.

The charges on the gates of transistors MS0 and MS1 (which are effectively capacitors) will, however, disperse as for any capacitor. Thus, in order to maintain the state of the dynamic CAM cell, the charge on the gates of the transistors MS0 and MS1 must be periodically refreshed. Contrail circuitry is therefore provided for periodically reading the voltages on the gates of the node transistors MS0 and MS1 and refreshing the charge.

In order to read data from the dynamic CAM cell, the data lines DS0 and DS1 are precharged HIGH. The read/write transistors MW0, MW1 are activated by the read/write line RW. This results in any charge stored on the gates of node transistors MS0 and MS1 being discharged to the data lines DS0 and DS1. A sense amplifier connected to the data lines DS0 and DS1 detects the discharge of the gates of the node transistors MS0 and MS1 and determines what binary digit was stored by the dynamic CAM cell.

In order to perform a match operation, match line M is precharged HIGH. Voltages corresponding to the desired charges on the gates of transistors MS0 and MS1 to represent the desired binary digit are then applied to the data lines DS0 and DS1 respectively. In other words, to match binary digit 1, data line DS0 is charged LOW and data line DS1 is charged HIGH. Likewise, to match binary digit 0, data line DS0 is charged HIGH and data line DS1 is charged LOW. If the charges on the gates of node transistors MS0 and MS1 match the voltages on the data lines DS0 and DS1, no current flows from the match line M and it remains charged HIGH. If the charges on the gates of either node transistors MS0 and MS1 do not match the voltages on the respective data line DS0, DS1, the match line M will discharge. Discharging of the match line M is detected by a sense amplifier attached to the match line M to generate an output indicating whether or not there is a match.

Dynamic CAM cells have the advantage that there is no problem of decreasing resistance for the writing operation as more cells are connected to data lines DS0 and DS1. Instead, data is stored capacitively, e.g. on the gates of node transistors MS0 and MS1. However, dynamic CAM cells must be periodically refreshed in order for them to maintain their data and this requires additional control circuitry and hence increased processing power and associated power consumption. Furthermore, capacitive coupling of the data lines DS0 and DS1 may destroy the data line in the cell. Complex timing schemes are also required for the sense amplifiers which generally must sample the voltages on the data lines at specific times.

Thus, It is desirable to provide a memory cell that solves the problems associated with conventional static memories and dynamic memories.

According to the present invention there is therefore provided a memory device comprising:

an array of memory cells, each of which can store, in use, a charge representing a binary digit of data, one or more data lines connected to one or more of the cells to apply a voltage to the cell(s) that enables the cell(s) to store the charge and onto which a voltage may be applied by the cell(s) to read the binary digit of data stored in the cell(s);

one or more read/write lines connected to one or more of the cells for selectively connecting the cell(s) to the data line(s) for the application of the voltage by the data lines to the cell(s) or the application of the voltage by the cells(s) to the data lines; and one or more control lines connected to one or more of the cells for controlling the configuration of the cells, wherein the cells are arranged such that the control line(s) can configure the cells to provide a capacitance to which the data line(s) can apply the voltage to the cell(s) and to maintain the charge stored by the cell(s) by virtue of a power supply to the cells thereafter.

This memory device, and in particular the controllable configuration of the memory cells solves the problems associated both with static memory cell structures and dynamic memory cell structures. The memory device of the invention has the many of the advantages of both static memories and dynamic memories, without several of the disadvantages of those devices.

For example, to write data to the memory cell, the data line(s) apply a voltage to a capacitance. This has the advantage associated with dynamic memory cells that the data lines can be connected to a large number of memory cells (e.g. in a column) without the need for powerful control circuitry to deal with the large changes in resistance according to the number of memory cells to which it is desired to write. Likewise, the high switching currents of the flip-flops or latches of static memory cells are eliminated. This decreases the power consumption of the memory device and obviates the need for complex power distribution strategies.

Furthermore, the ability of the memory cells to be configured to maintain the charge representing the binary digit of data obviates the need in dynamic memories for control circuitry for refreshing the charge stored in the cell by periodically reading and writing the data to and from the cell. Rather, the structure of the memory cells of the invention is effectively altered by the control lines to maintain the charge by virtue of a power supply to the cell. In other words, the structure of the memory cells is altered to a static form after a voltage has been applied to it (i.e. after the data has been written to the cell). This reduces the processing power required to operate the memory device.

Viewed in another way, according to the present invention there is therefore provided a memory cell arranged such that during the writing of data to the cell, the cell has a dynamic structure and during the reading of data from the cell, the cell has a static structure.

The memory cells may comprise one or more capacitors to which the voltage of the data line(s) is applied during the writing of data to the cell(s). However, it is preferable for the capacitance to which the data lines can apply the voltage to the cells to be the capacitance of a gate of a transistor. This simplifies the structure of the cell, keeping the number of semi-conductor components and hance the cost of manufacture to a minimum.

The charge stored by the memory cell(s) can be maintained in a variety of ways. However, in a preferred embodiment, the memory cells can be configured as a feedback loop to maintain the charges stored in the cell. It is particularly preferred for the memory cell(s) to comprise two cross coupled tri-state inverters as the feedback of such an arrangement can be straightforwardly turned on and off.

This, in itself is considered to be new and according to the present invention there is therefore provided a memory cell comprising two cross-coupled tri-state inverters.

In order to facilitate the control of the feedback loop, the memory cell(s) may be connected to two control lines that can turn the tri-state inverters on or off Also, the memory device may further comprise a control circuit for selectively applying voltages to the control line(s) to control the configuration of the cell(s).

To enable straightforward writing and reading of data to and from the cells, each memory cell can be is connected to a pair of data lines. Likewise, the memory device may further comprise one or more inverted read/write lines connected to one or more of the cells for selectively connecting the cell(s) to the data line(s) such that the pair of data lines are reversed.

In a preferred embodiment, the memory device may further comprise one or more match lines connected to one or more of the cells for indicating when a binary digit represented by voltages applied to the data line(s) of a cell corresponds with the binary digit represented by the charges stored in the cell. The cell(s) may each be connected to a pair of match lines.

As will be appreciated from the introduction to the application, the present invention is particularly applicable to CAMs (Content Addressable Memories). Thus, according to the present invention there is provided a Content Addressable Memory comprising the memory device of the invention.

Embodiments of the present invention will now be described by way of example only with reference to the accompanying drawings, in which.

An embodiment of the invention is described below in relation to a CAM (Content Addressable Memory). It would, however, be apparent to those skilled in the art that the invention is applicable to memory devices other than CAMS, such as RAMs (Random Access Memories) by making appropriate modifications to the device described below.

Figure 1:
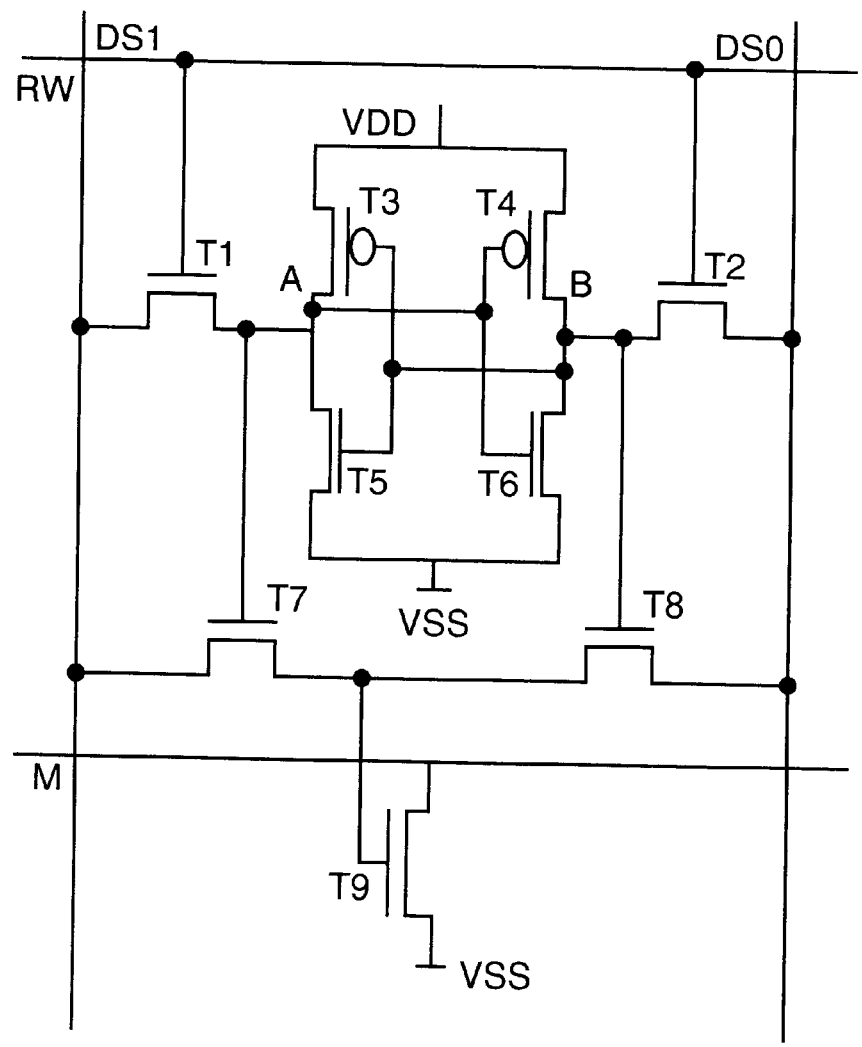
FIG. 1 is an illustration of a static CAM cell according to the prior art.
Figure 2:
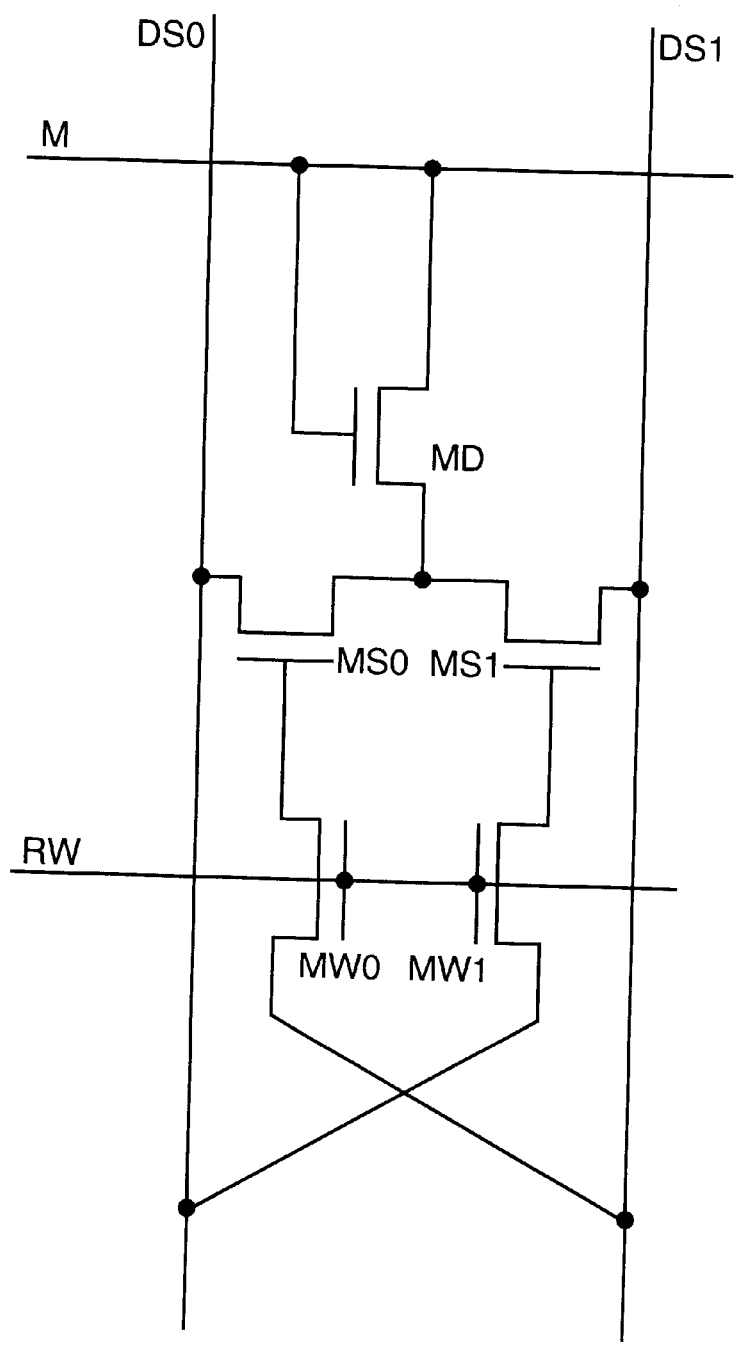
FIG. 2 is an illustration of a dynamic CAM cell according to the prior art.
Figure 3:
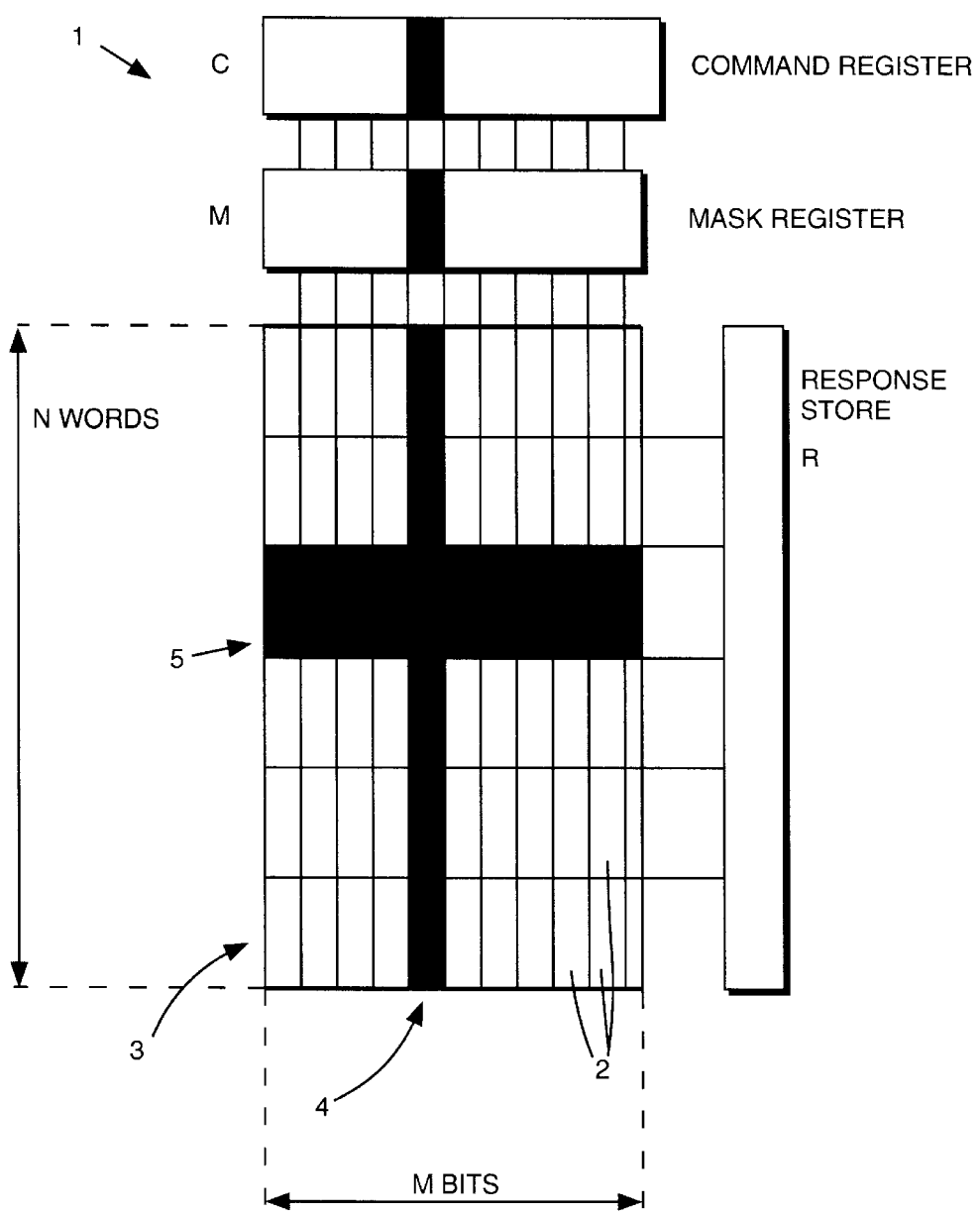
FIG. 3 is an illustration of a CAM (Content Addressable Memory) according to the present invention.

Referring to FIG. 3, a CAM 1 comprises a plurality of cells 2 arranged in an array 3. Each column 4 of cells 2 in the array 3 is referred to as a "bit slice" and each row 5 of cells 2 in the array 3 is referred to as a "word slice". The array 3 therefore has a width of m bits and a depth of n words.

Figure 4:
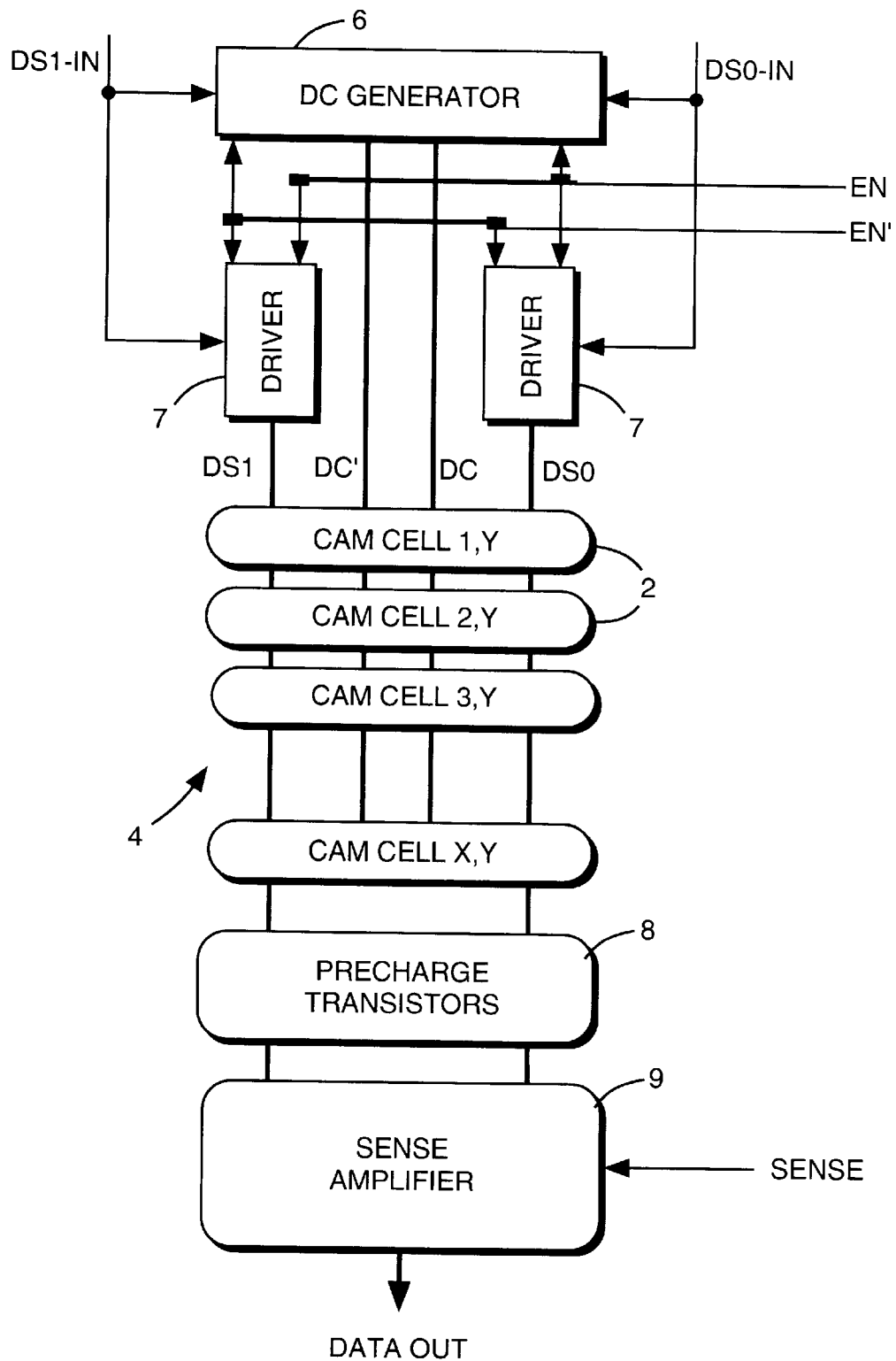
FIG. 4 is an illustration of a column of memory cells of the CAM of FIG. 3.
Figure 5:
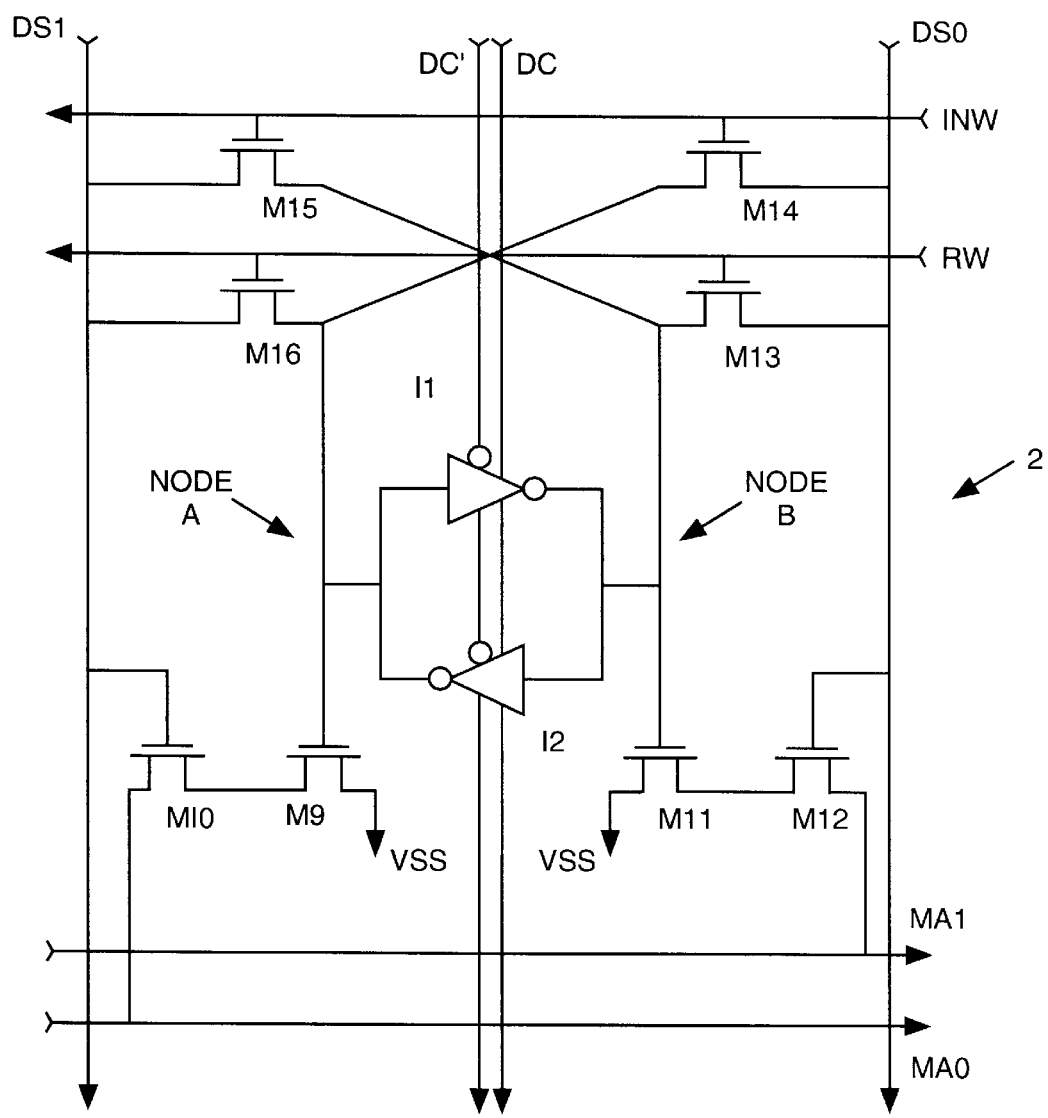
FIG. 5 is an illustration of a memory cell of the CAM of FIG. 3.

A comparand register C and mask register M are connected to columns 4 of cells 2 by data lines DS1 and DS0 shown in FIGS. 4 and 5. The columns 4 of cells 2 are also connected to control lines DC, DC'. Referring to FIG. 4, data lines DS1 and DS0 are supplied with a voltage by input lines DS1-IN and DS0-IN respectively. The supplied voltage may come from read/write circuitry (not shown) or comparand register C and mask register M. Input lines DS1-IN, DS0-IN are connected to data lines DS1, DS0 via drivers 7 and to control lines DC, DC' via DC generator 6. Drivers 7 control the voltage supplied to data lines DS1, DS0 and DC generator 6 controls the voltage supplied to control lines DC, DC'. The timing of the voltages supplied by drivers 7 and DC generator 6 is synchronised by enable lines EN, EN'. At the bottom of the columns 4, data lines DS1, DS0 are connected to precharge transistors 8 and sense amplifier 9.

A match line controller (not shown) and a response store R are connected to rows 5 of cells 2 by match lines M1 and M0 shown in FIG. 5. Each row 5 of cells 2 is also connected to a read/write line RW and an inverse read/write line INW, which in turn are connected to the read/write circuitry (not shown).

Each CAM cell 2 comprises 16 transistors M1 to M16 which are interconnected with each other and connected to data lines DS1, DS0, inverse read/write line INW, read/write line RW, match lines M1, M0 and control lines DC, DC'. Data is stored in the cells 2 primarily eight of the transistors M1 to M8 that are arranged as a pair of cross-coupled tri-state inverters I1, I2 in combination with node transistors M9 and M11. One side of the cross-coupled tri-state inverters I1, I2 is referred to as node A and the other side is referred to as node B. It is the charge of voltage on nodes A and B that is representative of the data stored in the cell 2.

Figure 6:
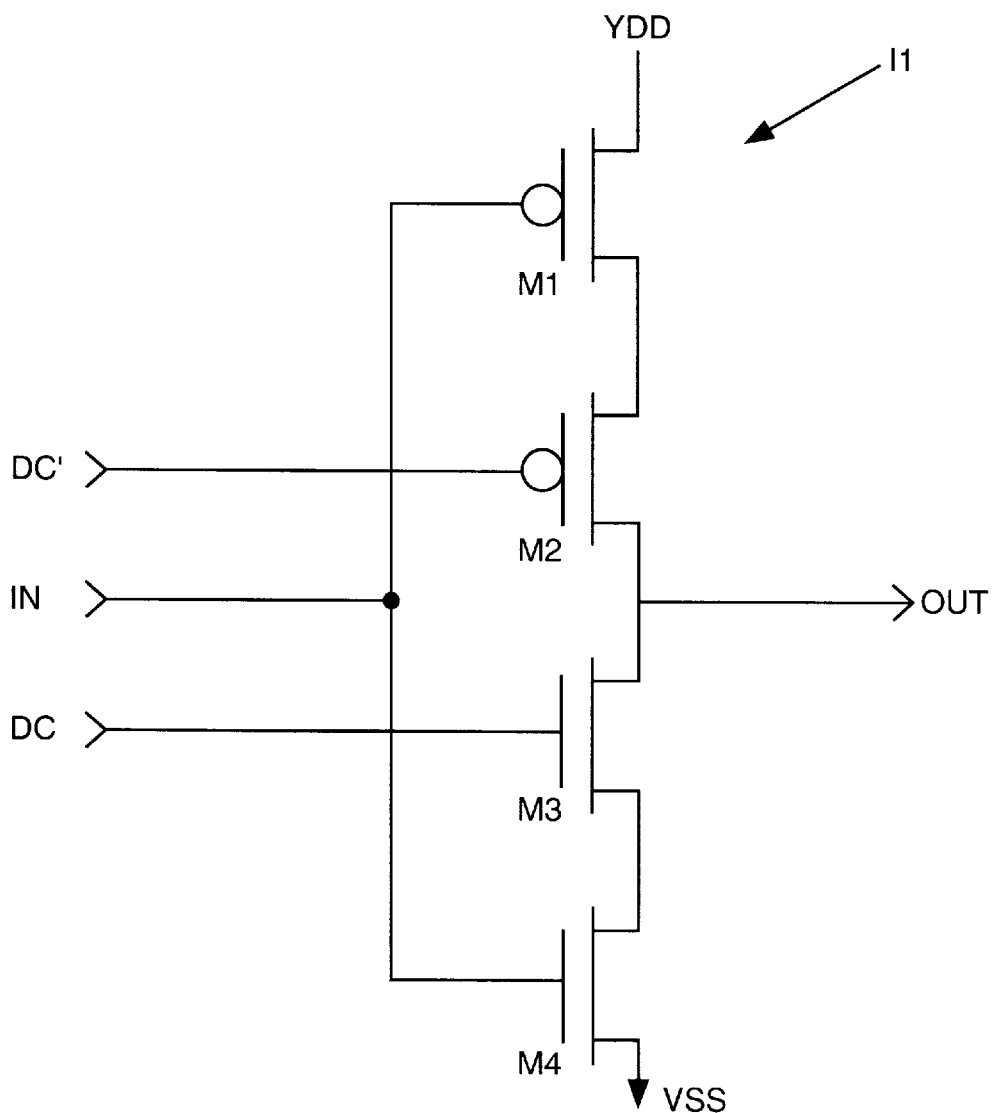
FIG. 6 is an illustration of a tri-state inverter of the memory cell illustrated in FIG. 5.

Referring to FIG. 6, the tri-state inverter I1 comprises four transistors M1 to M4. Two of the transistors M1, M2 are p-type transistors and two of the transistors M3, M4 are n-type transistors. The gates of one of the p-type transistors M1 and one of the n-type transistors M4 are connected to the input IN of the tri-state inverter I1. The gate of the other p-type transistor is connected to control line DC' and the gate of the other n-type transistor is connected to control line DC. The source and drain of each of the transistors M1 to M4 are connected in series from power source VDD to ground VSS. The connection from the p-type transistor M2 connected to control line DC' to n-type transistor M3 connected to control line DC forms the output OUT of tri-state inverter I1.

Tri-state inverter I2 is identical to tri-state inverter I1, comprising four further transistors M5 to M8 in place of transistors M1 to M4, and is not therefore illustrated separately. The output of each tri-state inverter I1, I2 is connected to the input of the other tri-state inverter I2, I1. Thus, the output of tri-state inverter I2 and the input of tri-state inverter I1 forms node A and the output of inverter I1 is and the input of inverter I2 forms node B.

Node A and node B are each connected to the gate of a node transistor M9, M11 such that when the inputs of the tri-state inverters I1, I2 are turned off (as described in further detail below) a charge may be stored on node A or node B as a result of the capacitance of the node transistor M9 of node A or the transistor M11 of node B.

Data line DS1 is connected to node A and node B by two separate transistors M15 and M16 respectively. Likewise, data line DS0 is connected to nodes A and nodes B by two separate transistors M14 and M13 respectively. The gates of the transistor M16 that connects data line DS1 with node A and the transistor M13 that connects data line DS0 with node B are connected to read/write line RW. Similarly, the gates of the transistor M15 that connects data line DS1 with node B and the transistor M14 that connects data line DS0 with node A are connected to inverse read/write line INW.

Match transistors M10, M12 are also provided for enabling a match operation to be performed on the cell 2. Match transistor M10 is connected between match line MA0 and node transistor M9 of node A, and the gate of match transistor M10 in connected to data line DS1. Likewise, match transistor M12 is connected between node transistor M11 of node B and match line MA1, and the gate of match transistor M12 is connected to data line DS0.

Figure 7:
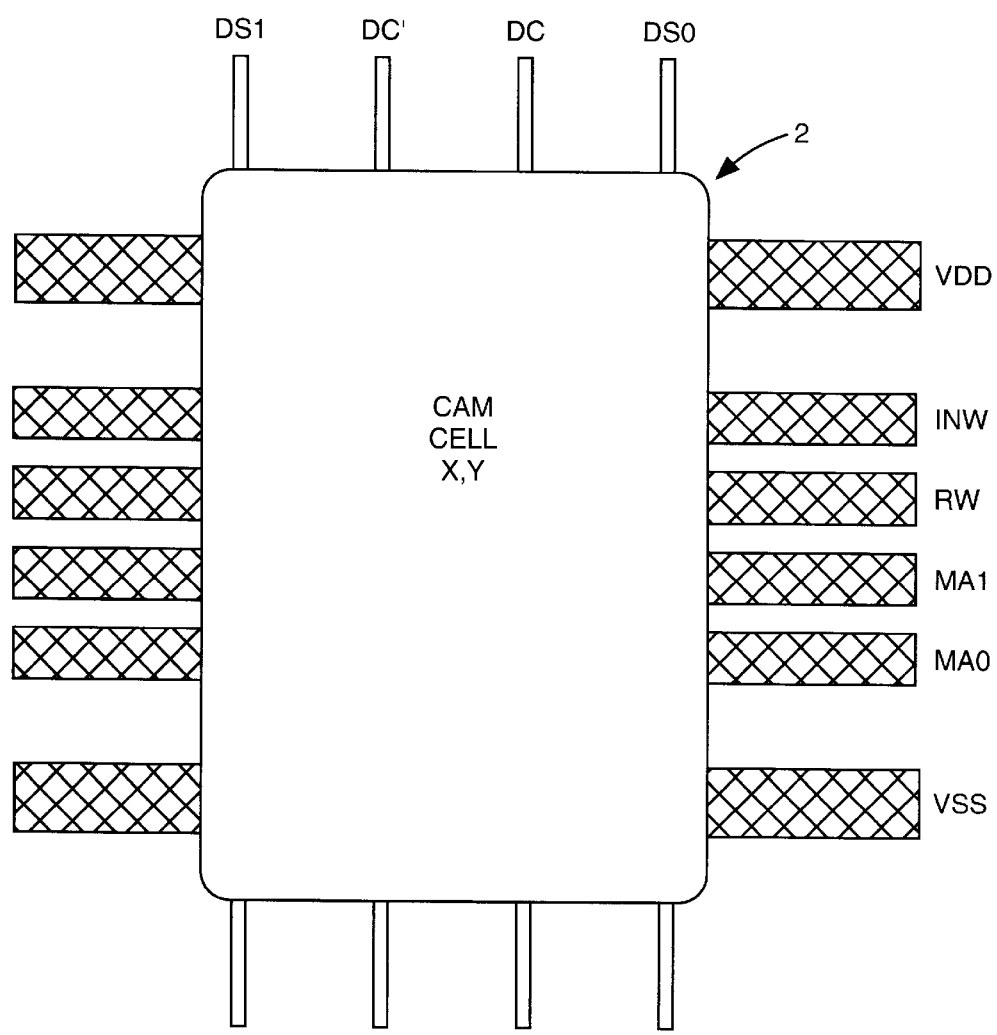
FIG. 7 is a schematic illustration of the memory cell of FIG. 5 fabricated on a semiconductor chip.
Figure 8:
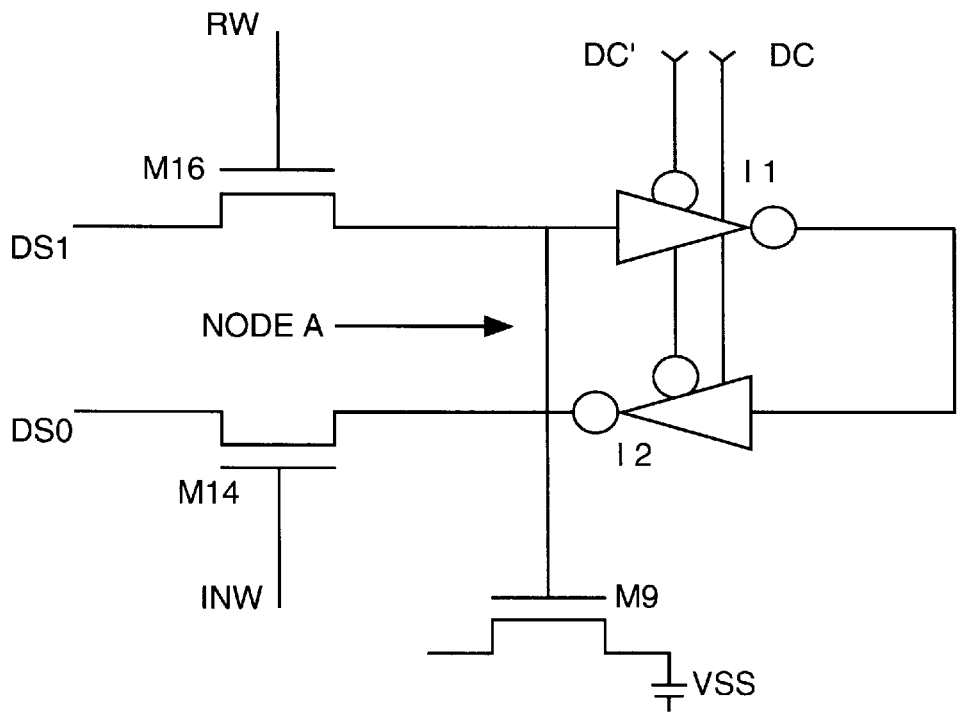
FIG. 8 is an illustration of a portion of the memory cell of FIG. 5 during a write operation.
Figure 9:
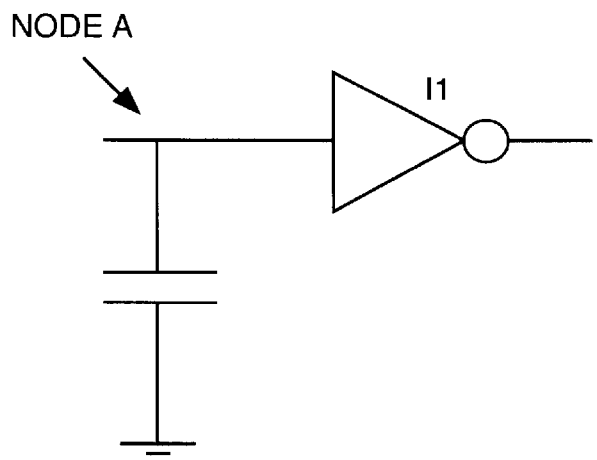
FIG. 9 is a schematic illustration of the portion of the memory device of FIG. 5 during a write operation.

The components of CAM cells 2 and the various electrical connections between these components are normally be provided as a semiconductor device, i.e. as a microchip formed on a silicon substrate. Referring to FIG. 7, in such a device, data lines DS1, DS0 and control lines DC', DC are provided in a first layer of metal on a silicon substrate. Power supply VDD, ground VSS, inverse read/write line INW, read/write line RW and match lines MA1 and MA0 are provided as a second layer of metal on a silicon substrate. The components of memory cells 2 are likewise provided on the silicon substrate with appropriate connections to the two layers of metal. Conventional processes for fabricating semiconductor devices are suitable for manufacturing the memory device according to the invention.

When it is desired to write data to one of the memory cells 2, the drivers 7 of the column 4 of the memory cell 2 apply appropriate voltages to the data lines DS1, DS0. More specifically, the drivers 7 charge data line DS1 HIGH and data line DS0 LOW. At the same time DC generator 6 charge the voltage on control line DC' HIGH and the voltage on control line DC LOW. The application of voltages data to data lines DS1, DS0 and to control lines DC, DC' is initiated by enable lines EN, EN'.

To activate the selected cell 2 in the column 4 to which the data is to be written, either the read/write line RW or the inverse read/write line INW of the appropriate column is charged HIGH. Applying a voltage to the read/write line RW activates transistors M16 and M13. As data line DS1 is HIGH, node A will therefore have a high voltage applied to it. Node B will have no voltage applied to it. This state is representative of bit 1. Alternatively, applying a voltage to the inverse read/write line INW activates transistors M15 and M14. As data line DS1 is HIGH, node B will therefore have a high voltage applied to it. Node A will have no voltage applied to it. This state is representative of bit 0.

As control line DC' is HIGH and control line DC is LOW both the tri-state inverters IN1, IN2 are off. Thus, the charge applied to node A will simply be stored on the capacitance of the gate of the node transistor M9 of node A. Likewise, the charge applied to node B will simply be stored on the capacitance of the gate of the node transistor M11 of node B.

At the end of the write operation, read/write line RW (or inverse read/write line INW) is turned off. At the same time control line DC' connected to a low voltage and control line DC is connected to high voltage. The tri-state inverters I1, I2 are therefore turned on, forming a feedback loop which maintains the voltage states at nodes A and B.

During the write operation, the data lines DS1, DS0 provide a charge on a capacitance in either node A or node B. It is not required for the data lines DS1, DS0 to toggle a flip-flop or alter the state of a latch and a negligible resistive load is applied to DS1 or DS0. Thus, memory cell 2 has the advantage of a conventional dynamic cam cell that the drivers 7 need not generate significant power and a large number of memory cells 2 can be provided along data lines DS1, DS0. Thus, memory cell 2 is suitable for VLSI (Very Large Scale Integration) devices. Furthermore, once the data has been written to the memory cell 2, the feedback loop maintains the state of the cell 2 without the read/write operations of conventional dynamic CAMs and the associated external processing required by convention refresh operations.

In order to read data from the memory cell 2, precharge transistors 8 charge the data lines DS1, DS0 to the voltage of VDD. The read/write line RW is then driven high and read/write transistors M14, M13 are enabled. One of the data lines DS1, DS0 will be discharged. Sense amplifier 9 detects the discharge of data line DS1 or DS0 and outputs data indicating the value of the binary digit stored in the memory cell 2.

In order to determine whether data stored in a memory cell 2 matches a given data, the data lines DS1, DS0 are discharged and the match lines M1, M0 are precharged. The data lines DS1, DS0 are then charged in the opposite way to that for writing the given bit of data to the memory cell 2. In other words, in order to search for binary digit 1, DS1 is charged LOW and DS0 is charged HIGH. Similarly, in order to search for a "don't care" state, DS1 charged LOW and DS0 is charged LOW.

If the state of memory cell 2 matches that for the bit of data that is being searched for, the match lines M1, M0 remain precharged. If any mismatch is detected one of the match lines M1, M0 will be discharged. A sense amplifier is connected to the match lines M1, M0 to detect any discharging of the match lines M1, M0 and output data indicating a match or mismatch.

What is claimed is:

1. A memory device comprising:
   an array of memory cells, when in use, each of which to store a charge representing a binary digit of data,
   a plurality of data lines connected to the array of memory cells, wherein each memory cell is connected to a pair of data lines, each data line to apply a voltage to a particular memory cell to enable the particular memory cell to store the charge, and each data line to receive the voltage applied by the particular memory cell to read the binary digit of data stored in the particular memory cell;
   a plurality of read/write lines connected to the array of memory cells to selectively connect the array of memory cells to the plurality of data lines to apply the voltage to the memory cells or receive the voltage from the memory cells;
   a plurality of control lines connected to the array of memory cells to control configuration of the memory cells, wherein the memory cells are arranged such that the plurality of control lines configure the memory cells to provide a capacitance to which the data lines can apply the voltage and to configure the memory cells to maintain the charge stored in each memory cell by virtue of a power supply; and
   a plurality of inverted read/write lines connected to the array of memory cells to selectively connect the array of memory cells to the plurality of data lines such that the pair of data lines are reversed.

2. The memory device of claim 1, wherein the capacitance is a capacitance of a gate of a transistor.

3. The memory device of claim 1 wherein the plurality of memory cells are configured as a feedback loop to maintain the charge stored at each memory cell.

4. The memory device of claim 1, wherein each of the array of memory cells comprises two cross coupled tri-state inverters.

5. The memory device of claim 4, wherein each of the array of memory cells is connected to two control lines that control power supplied to the tri-state inverters.

6. The memory device of claim 1, further comprising a control circuit for selectively applying voltages to the plurality of control lines to control the configuration of the memory cells.

7. The memory device of claim 1, further comprising a plurality of match lines connected to the array of memory cells to indicate when a binary digit represented by a voltage applied to a particular data line corresponds with a binary digit represented by a voltage stored in a respective memory cell.

8. The memory device of claim 7, wherein each memory cell is connected to a pair of match lines among the plurality of match lines.

9. The memory device of claim 1, wherein the array of memory cells comprise a Content Addressable Memory (CAM).

10. The memory device of claim 1 wherein the array of memory cells is arranged as a dynamic structure during a write operation and arranged as a static structure during a read operation.

11. The memory device of claim 1 wherein a memory cell within the array of memory cells comprises two cross-coupled tri-state inverters.

12. A method of operating a memory cell comprising:
    writing data to the cell such that the cell has dynamic characteristics; and
    reading data from the cell such that the cell has static characteristics, wherein the cell is connected to a pair of data lines and an inverted read/write line to selectively connect the memory cell to the data lines such that the pair of data lines are reversed.

* * * * *